United States Patent
Obradovic et al.

(10) Patent No.: US 11,290,110 B2
(45) Date of Patent: Mar. 29, 2022

(54) METHOD AND SYSTEM FOR PROVIDING A VARIATION RESISTANT MAGNETIC JUNCTION-BASED XNOR CELL USABLE IN NEUROMORPHIC COMPUTING

(71) Applicant: Samsung Electronics Co., Ltd., Gyeonggi-do (KR)

(72) Inventors: Borna J. Obradovic, Leander, TX (US); Titash Rakshit, Austin, TX (US); Ryan M. Hatcher, Austin, TX (US); Jorge A. Kittl, Lakeway, TX (US); Mark S. Rodder, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 1085 days.

(21) Appl. No.: 15/886,179

(22) Filed: Feb. 1, 2018

(65) Prior Publication Data

US 2019/0131977 A1 May 2, 2019

Related U.S. Application Data (60) Provisional application No. 62/577,274, filed on Oct. 26, 2017.

(51) Int. Cl.
*H03K 19/21* (2006.01)
*G06N 3/063* (2006.01)
*H03K 19/18* (2006.01)

(52) U.S. Cl.
CPC .......... *H03K 19/215* (2013.01); *G06N 3/063* (2013.01); *H03K 19/18* (2013.01)

(58) Field of Classification Search
CPC ....... H03K 19/215; H03K 19/18; G06N 3/063

USPC ........................................................... 706/33
See application file for complete search history.

(56) References Cited

U.S. PATENT DOCUMENTS

| | | |
|---|---|---|
| 7,396,777 B2 | 7/2008 | Jung |
| 8,470,659 B2 | 6/2013 | Yao |
| 8,580,698 B2 | 11/2013 | Lee |
| 8,603,924 B2 | 12/2013 | Yao |
| 8,653,516 B1 | 2/2014 | Nelson |
| 2006/0258078 A1 | 11/2006 | Lee et al. |
| 2011/0256682 A1 | 10/2011 | Yu et al. |
| 2013/0316546 A1 | 11/2013 | Tong |
| 2017/0169873 A1* | 6/2017 | Appeltans ........... G11C 11/1657 |

* cited by examiner

*Primary Examiner* — Tomi Skibinski
(74) *Attorney, Agent, or Firm* — Lewis Roca Rothgerber Christie LLP (57) ABSTRACT

A hardware cell and method for performing a digital XNOR of an input signal and weights are described. The hardware cell includes input lines, a plurality of pairs of magnetic junctions, output transistors and at least one selection transistor coupled with the output transistors. The input lines receive the input signal and its complement. The magnetic junctions store the weight. Each magnetic junction includes a reference layer, a free layer and a nonmagnetic spacer layer between the reference layer and the free layer. The free layer has stable magnetic states and is programmable using spin-transfer torque and/or spin-orbit interaction torque. The first magnetic junction of a pair receives the input signal. The second magnetic junction of the pair receives the input signal complement. The output transistors are coupled with the magnetic junctions such that each pair of magnetic junctions forms a voltage divider. The output transistors form a sense amplifier.

17 Claims, 6 Drawing Sheets

METHOD AND SYSTEM FOR PROVIDING A VARIATION RESISTANT MAGNETIC JUNCTION-BASED XNOR CELL USABLE IN NEUROMORPHIC COMPUTING

CROSS-REFERENCE TO RELATED APPLICATIONS

This application claims the benefit of provisional Patent Application Ser. No. 62/577,274, filed Oct. 26, 2017, entitled "A VARIATION-RESISTANT STT-BASED XNOR CELL FOR NEUROMORPHIC COMPUTING", assigned to the assignee of the present application, and incorporated herein by reference.

BACKGROUND

Applications involving Deep-Learning Neural Networks (NNs) or neuromorphic computing such as image recognition, natural language processing and more generally various pattern-matching or classification tasks are quickly becoming as important as general-purpose computing. The essential computational element of the NN, or neuron, multiplies of a set of input signals by a set of weights and sums the products. Thus, the neuron performs a vector-matrix product, or multiply-accumulate (MAC) operation. A NN generally includes a large number of interconnected neurons, each of which performs a MAC operation. Thus, operation of a NN is computationally intensive.

Performance of a NN may be improved by improving the efficiency of the MAC operation. It would be desirable to store weights locally to reduce power and the frequency of DRAM accesses. It may also be desirable to perform the MAC operation digitally to aid in reducing noise and process variability. A binary neuron may be capable of meeting these goals. It has been shown that a workable binary neuron can be implemented via XNOR operations. The weights, w, for such an XNOR neuron are mathematically 1 and −1 and are represented digitally as 1 and 0. The signals, x, are likewise 1 and −1, and are represented digitally by 1 and 0. The result of the multiplication operation $p_i = w_i x_i$ is positive only when either x and w are both 1, and when they are both −1 (0 in Boolean representation). This is just the logical negation of the exclusive-OR operation (XNOR). Thus, the product of individual weights and signals can be completed via an XNOR logic cell. The complete MAC operation for a given neuron is expressed as sum=$\Sigma_{\{i=1\}}^{n} w_i x_i$, or in Boolean terms, sum=2 Count(XNOR (w, x))−n. The count operation counts the number of nonzero results of the XNOR expression and n is the total number of inputs to the neuron. The result is then thresholded against a bias, resulting in a high or low output of the neuron. The entire process is digital. No information loss associated with analog processing is incurred.

Although such binary networks need substantially more neurons than analog (or multi-bit digital) networks for the same level of overall accuracy, the purely digital implementation may be desired when the goals of reducing noise and providing immunity to process variation are paramount. Thus, what is desired is an improved XNOR logic cell to enhance operation of digital NNs or other logic operations.

BRIEF SUMMARY OF THE INVENTION

A hardware cell and method for performing a digital XNOR operation of an input signal and weights are described. The hardware cell includes input lines, a plurality of pairs of magnetic junctions, output transistors and at least one selection transistor. The input lines receive the input signal and an input signal complement. The pairs of magnetic junctions are coupled with the input lines and store the weight. Each pair of magnetic junctions includes a first magnetic junction and a second magnetic junction. Each magnetic junction includes a reference layer, a free layer and a nonmagnetic spacer layer between the reference layer and the free layer. The free layer has a plurality of stable magnetic states and is programmable using at least one of spin-transfer torque (STT) and spin-orbit interaction torque (SOT). The first magnetic junction receives the input signal. The second magnetic junction receives the input signal complement. The output transistors are coupled with the magnetic junctions such that each pair of magnetic junctions forms a voltage divider. The output transistors form a sense amplifier. The at least one selection transistor is coupled with the plurality of output transistors.

The hardware cell can perform XNOR operations digitally and efficiently and may be insensitive to global processing variations.

DETAILED DESCRIPTION OF THE INVENTION

The exemplary embodiments relate to XNOR logic devices that may be employed in a variety of fields including but not limited to machine learning, artificial intelligence, neuromorphic computing and neural networks. The method and system may be extended to other applications in which logic devices are used. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations.

Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or fewer components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

A hardware cell and method for performing a digital XNOR operation of an input signal and a weight are described. The hardware cell includes input lines, a plurality of pairs of magnetic junctions, output transistors and at least one selection transistor. The input lines receive the input signal and an input signal complement. The pairs of magnetic junctions are coupled with the input lines and store the weight. Each pair of magnetic junctions includes a first magnetic junction and a second magnetic junction. Each magnetic junction includes a reference layer, a free layer and a nonmagnetic spacer layer between the reference layer and the free layer. The free layer has a plurality of stable magnetic states and is programmable using at least one of spin-transfer torque (STT) and spin-orbit interaction torque (SOT). The first magnetic junction receives the input signal. The second magnetic junction receives the input signal complement. The output transistors are coupled with the magnetic junctions such that each pair of magnetic junctions forms a voltage divider. The output transistors form a sense amplifier. The at least one selection transistor is coupled with the plurality of output transistors.

Figure 1:
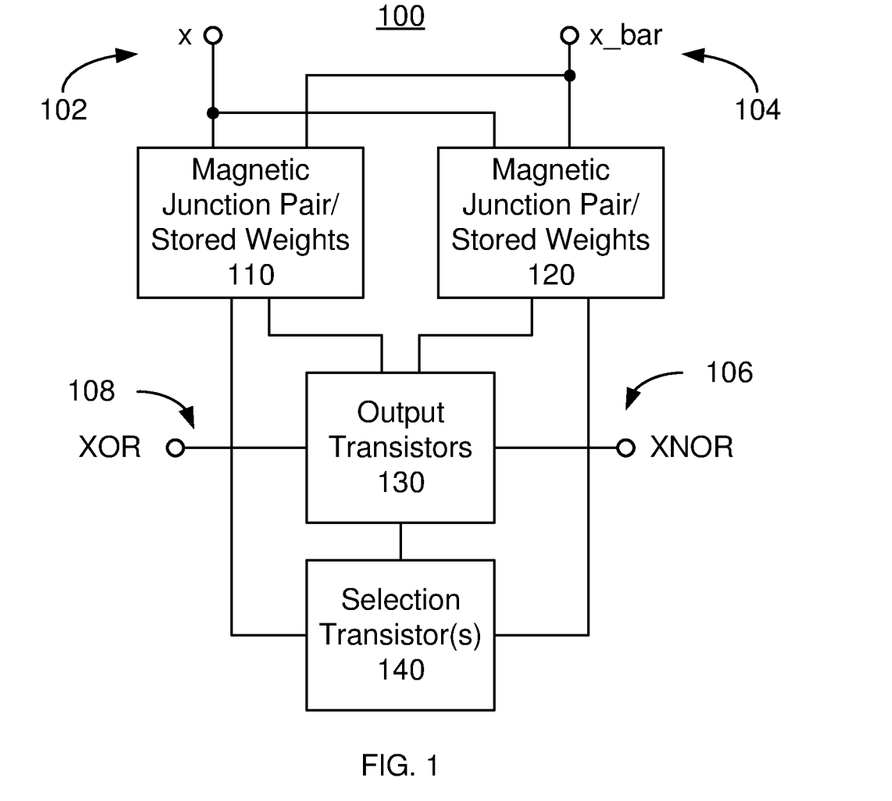
FIG. 1 is a block diagram depicting an exemplary embodiment of a hardware XNOR cell.

FIG. 1 is a high level block diagram depicting an exemplary embodiment of a hardware XNOR cell 100. For simplicity, only a portion of the XNOR cell 100 is shown. The XNOR cell 100 digitally performs the XNOR operation on an input signal and a weight. Thus, the XNOR cell 100 can be considered a neuromorphic computing cell.

The XNOR cell 100 includes at least two sets 110 and 120 of magnetic junctions, output transistors 130 and selection transistors 150. In some embodiments, an input stage (not shown in FIG. 1) may be included. Also shown are input lines 102 and 104 and output lines 106 and 108. The input lines 102 and 104 receive the input signal and its complement, respectively. The output line 106 provides the resultant of the XNOR operation. Optional output line 108 provides the complement of the output of interest. In other words, the XOR is provided on output line 108.

The XNOR cell 100 includes at least four magnetic junctions organized into pairs/sets 110 and 120. In other embodiments, sets 110 and 120 of magnetic junctions may include more than two magnetic junctions. Each of the magnetic junctions includes a reference layer, a free (data storage) layer and a nonmagnetic spacer layer between the reference and free layers. The reference layer and free layer are ferromagnetic and may be multilayers. The reference layer magnetic moment may be substantially fixed, while the free layer magnetic moment may be switched between stable states. The nonmagnetic spacer layer is a tunneling barrier in some embodiments. In such embodiments, the magnetic junctions are magnetic tunneling junctions (MTJs). In other embodiments, the nonmagnetic spacer layer may be a conductor or other layer. Other layers such as seed layers, polarization enhancement layers, capping layers, additional nonmagnetic spacer layers, additional reference layers and the like may also be included in each magnetic junction.

The free layer has two stable magnetic states: magnetic moment substantially parallel to the reference layer magnetic moment (low resistance) and magnetic moment substantially antiparallel to the reference layer magnetic moment (high resistance). These states correspond to a logical "0" and "1". Thus, the magnetic junctions can store the binary/logical weights for the XNOR cell 100. The weights may be programmable into the magnetic junctions in a number of ways including but not limited to spin transfer torque (STT) and spin-orbit coupling torque (SOT) such as the spin Hall effect. STT originates from a current driven perpendicular-to-plane through the magnetic junction. SOT is due to a current driven in plane in proximity to the free layer of the magnetic junction. The magnetic junctions in pairs 110 and 120 also function as resistors in the XNOR cell 100. The magnitude of the resistance depends upon the state of the free layer and, therefore, the weight stored by the magnetic junction.

The XNOR cell 100 also includes multiple output transistors 130 that are connected to the pairs 110 and 120 of magnetic junctions. The output transistors are connected such that the magnetic junctions in each pair 110 and 120 forms a voltage divider between the inputs 102 (x) and 104 (x_bar). For example, the output transistors 130 may be connected between the first magnetic junction and the second magnetic junction of a pair. The output transistors 130 are also interconnected form a sense amplifier.

In operation, the input, x, and its complement, x_bar, are driven through the pairs 110 and 120 of magnetic junctions. The resistances of the magnetic junctions within the pairs 110 and 120 vary based upon the weights programmed into the magnetic junctions. The output transistors 130 are connected such that the outputs 106 and 108 are driven to the XNOR and XOR, respectively, of the input signal x with the weight, w, stored by the magnetic junctions. Selection transistor(s) 140 select the XNOR cell 100 for operation. For example, the selection transistor(s) 140 might be connected between the pairs 110 and 120 of magnetic junctions and the output transistors 130 and may selectively decouple the magnetic junctions from the output transistors 130. Alternatively, the selection transistor(s) 140 may be between the output transistors 130 and ground. Thus, the selection transistor(s) 140 may decouple the XNOR cell 100 from ground.

Because it is implemented in hardware, the XNOR cell 100 may carry out the XNOR operation efficiently. Further, because the output is digital, issues with analog XNOR operations may be reduced or eliminated. Moreover, the signal outputs are taken from a voltage divider that is essentially composed only of magnetic junctions. Consequently, the voltage provided by the divider is insensitive to global processing variations. The weights are also stored locally in the magnetic junctions 110 and 120, which function both as nonvolatile memory and resistors for a voltage divider. The XNOR cell may, therefore, perform XNOR operations digitally, efficiently and with an output that is insensitive to global processing variations.

Figure 2:
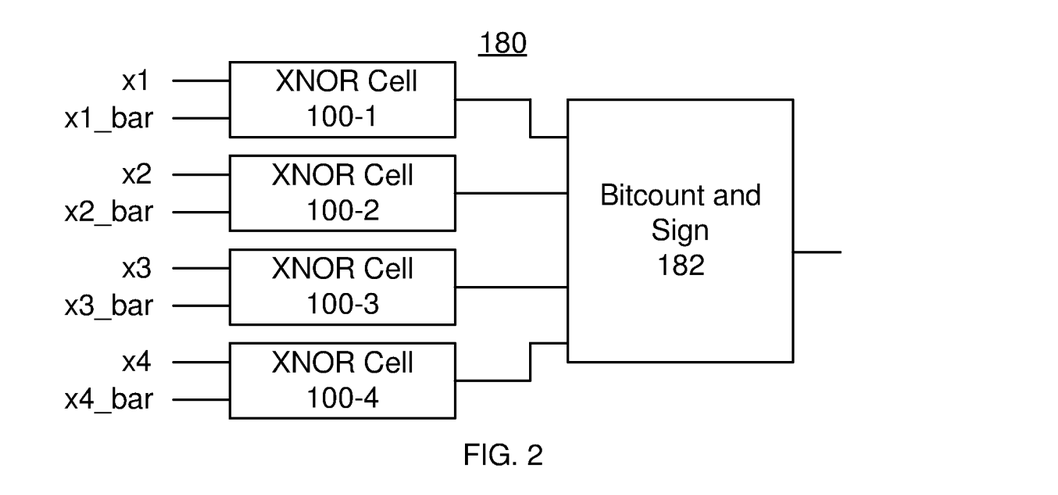
FIG. 2 is a block diagram depicting an exemplary embodiment of a portion of a neural network including multiple XNOR cells and performing a multiple-and-accumulate operation.

FIG. 2 is a block diagram depicting an exemplary embodiment of a portion 180 of a binary neural network. The portion 180 may be considered to be a binary neuron. The binary neuron 180 performs a multiply-and-accumulate (MAC) operation. The binary neuron 180 illustrates a possible use of the XNOR cell 100 and is not intended to be limiting.

The neuron 180 includes multiple XNOR cells 100-1, 100-2, 100-3 and 100-4 (collectively XNOR cells 100) and bit count and sign block 202. In this embodiment, four inputs x1, x2, x3 and x4 are desired to be combined with four weights. Consequently, four XNOR cells 100 are used. Each of the XNOR cells 100-1, 100-2, 100-3 and 100-4 shown in FIG. 2 operate in a manner analogous to the XNOR cell 100 depicted in FIG. 1.

The bit count and sign block 182 counts the number of non-zero results from the four XNOR cells 100 and subtracts four (the number of input signals to the neuron 180). The result is then thresholded against a bias, resulting in a high or low output of the neuron 180.

The binary neuron 180 using the XNOR cells 100 may thus perform a MAC operation. Because it uses cells implemented in hardware, the binary neuron 180 operates efficiently. The MAC operation may be performed digitally, which avoids issues with analog XNOR operations. As discussed with respect to FIG. 1, the XNOR operations performed by the XNOR cells 100 may also be insensitive to global processing variations. Performance of the binary neuron 180 may, therefore, improve.

Figure 3:
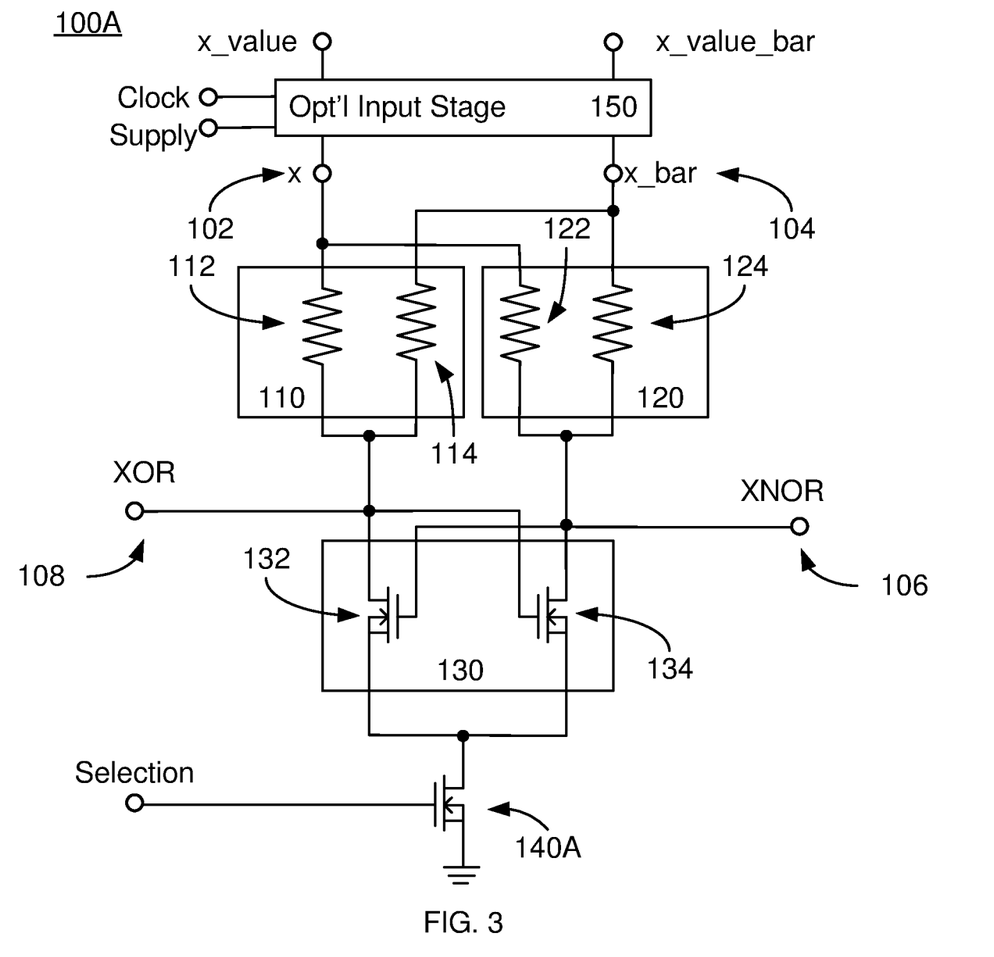
FIG. 3 depicts an exemplary embodiment of a hardware cell for performing a digital XNOR operation.

FIG. 3 depicts an exemplary embodiment of a hardware cell 100A for performing a digital XNOR operation. The XNOR cell 100A is analogous to the XNOR cell 100 and may be used in the binary neuron 180 or other application. Consequently, portions of the XNOR cell 100A analogous to components in the XNOR cell 100 are labeled similarly. Thus, the XNOR cell 100A includes input lines 102 and 104, pairs 110 and 120 of magnetic junctions, output transistors 130, output lines 106 and 108 and a selection transistor 140A that are analogous to input lines 102 and 104, pairs 110 and 120 of magnetic junctions, output transistors 130, output lines 106 and 108 and selection transistor(s) 140, respectively. Also shown is an optional input stage 150.

The input lines 102 and 104 carry input signal x and its complement x_bar, respectively. The input lines 102 and 104 are connected to pairs 110 and 120 of magnetic junctions 112 and 114 and magnetic junctions 122 and 124, respectively. Magnetic junctions 112 and 122 receive the input signal x, while the magnetic junctions 114 and 124 receive the input signal complement. During operation, the magnetic junctions 112, 114, 122 and 124 function as resistive elements and are, therefore, depicted as resistors. However, the value of the resistances (high or low) depends upon the weights stored in each magnetic junction 112, 114, 122 and 124, respectively. For example, STT and/or SOT may be used to program the magnetic junctions 112. In each pair of magnetic junctions, the weight and its complement are stored. Thus, the magnetic junctions 114 and 122 may store the weight, while the magnetic junctions 112 and 124 store the complement of the weight. Consequently, the magnetic junctions 114 and 122 are in a high resistance state when the magnetic junctions 112 and 124 are in a low resistance and vice versa.

Figure 4A:
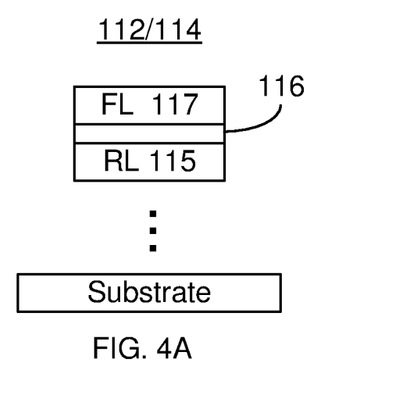
FIGS. 4A and 4B depict exemplary embodiments of a magnetic junctions usable in the hardware cell that performs a digital XNOR operation.
Figure 4B:
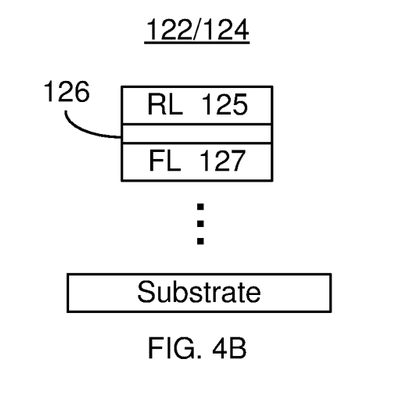

The magnetic junctions 112 and 114/pair 110 may be desired to have opposite orientations with respect to the substrate from the magnetic junctions 122 and 124/pair 120. For example, FIGS. 4A and 4B depict magnetic junctions 112/114 and 122/126, respectively, in one embodiment. The magnetic junctions 112/114 each include a reference layer 115, a nonmagnetic spacer layer 116 and a free layer 117. The reference layer 115 has a substantially fixed magnetic moment. The nonmagnetic spacer layer 116 may be a tunneling barrier layer. The free layer 117 has a magnetic moment that is programmable, for example via SOT and/or STT. Similarly, the magnetic junctions 122/124 each include a reference layer 125, a nonmagnetic spacer layer 126 and a free layer 127. The reference layer 127 has a substantially fixed magnetic moment. The nonmagnetic spacer layer 126 may be a tunneling barrier layer. The free layer 117 has a magnetic moment that is programmable for example, via SOT and/or STT. As can be seen from a comparison of FIGS. 4A and 4B, the magnetic junctions 112/114 are oriented with the free layer 117 further from the underlying substrate than the reference layer 115 is. Conversely, the magnetic junctions 122 and 124 are oriented "bottom-up" with the free layer 117 closer to the underlying substrate than the reference layer 125 is. The magnetic junctions 112 and 114 thus may have the conventional orientation, while the magnetic junctions 122 and 124 may have the bottom-up configuration. Such a configuration allows for simpler interconnects to the magnetic junctions 112, 114, 122 and 124. In alternate embodiments, the orientations might be switched or all magnetic junctions 112, 114, 122 and 124 may have the same orientation. For example, all of the magnetic junctions 112, 114, 122 and 124 may have the conventional orientation or all may have the bottom up orientation. The XNOR cell 100A still functions for varying orientations, but may be desired to have a somewhat different and potentially more complicated interconnect structure.

Referring back to FIG. 3, the output transistors 130 include output transistor 132 and output transistor 134. The output transistors 132 and 134 are cross coupled. Thus, the output transistor 132 has its drain connected between the magnetic junctions 112 and 114 and to the XOR output 108. The gate of output transistor 132 is connected to the output 106 and to the drain of the output transistor 134. The output transistor 134 has its drain connected between the magnetic junctions 122 and 124 and to the XNOR output 106. The gate of output transistor 134 is connected to the output 108 and the drain of the output transistor 132. Thus, the output transistors form a sense amplifier for the voltages between the magnetic junctions 112 and 114 and between the magnetic junctions 122 and 124.

The selection transistor includes 140A is connected between ground and the sources of output transistors 132 and 134. Thus, when enabled, by selection input, the XNOR cell 100A is operational.

The optional input stage 150 may be used to facilitate operation of the XNOR cell 100A. If the input stage is omitted, x and x_bar are simply the signals x_value and x_value_bar, respectively. If the input stage 150 is used, then the input signals x and x_bar are the signals x_value and x_value_bar for a portion of a cycle of operation and are driven high for a remaining portion of the cycle of operation. For example, the input stage 150 may provide x_value and x_value_bar as x and x_bar for a first clock cycle and a high input for both x and x_bar for a second clock cycle. Operation of the XNOR cell 100A then takes two clock cycles to complete. Alternatively, the optional input stage 150 may provide x_value and x_value_bar as x and x_bar for a first portion of a clock cycle and a high input for both x and x_bar for a second portion of the clock cycle. If the input stage 150 is omitted, x and x_bar are simply x_value and x_value_bar. The XNOR cell 100A still functions. However, because of the voltage divider, the high output of the XNOR cell 100A is noticeably less than a supply voltage.

Figure 5:
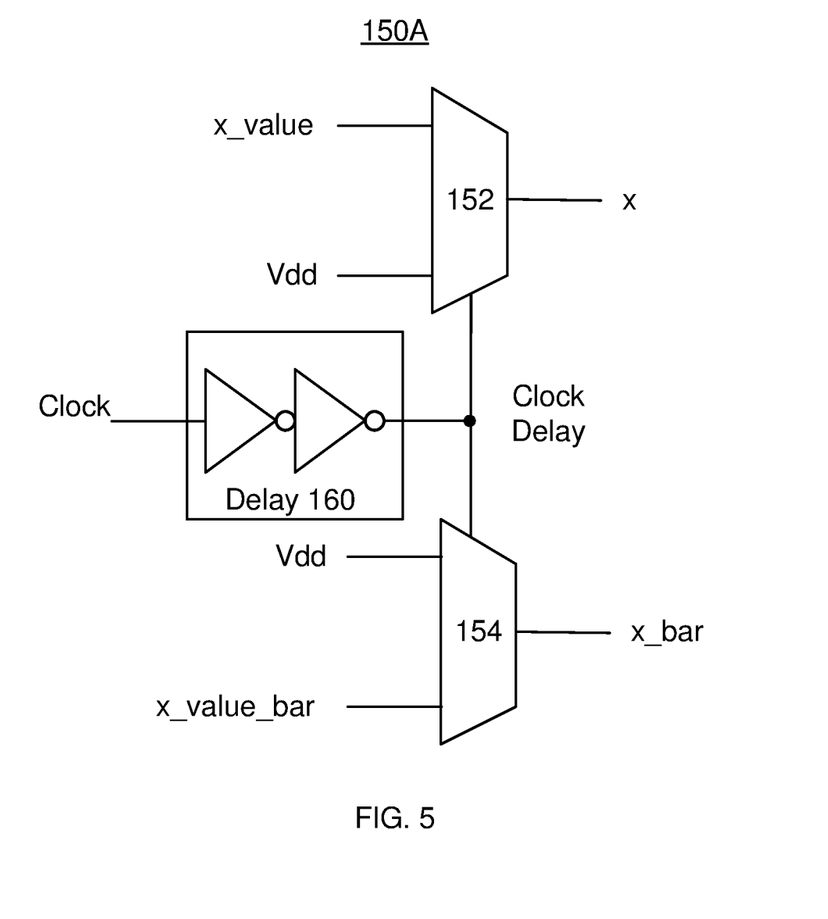
FIG. 5 depicts an exemplary embodiment of an optional input stage for a digital hardware XNOR cell.

FIG. 5 depicts an exemplary embodiment of an input stage 150A that may be used for the optional input stage 150. In other embodiments, other circuits might be used. The input stage 150A includes multiplexers 152 and 154 and delay 160. The multiplexers 152 and 154 have x_value and x_value bar, respectively, as inputs. The multiplexers 152 and 154 also have the supply voltage Vdd as an input. In the first half of the clock cycle, the multiplexers 152 and 154 output x_value and x_value_bar as x and x_bar, respectively. After the delay of, for example, half a clock cycle passes, the delay block 160 switches operation of the multiplexers 152 and 154. The multiplexers 152 and 154 then output the supply Vdd as both x and x_bar.

FIGS. 6A-6E depict timing diagrams depicting operation of the XNOR cell 100A. Thus, for all graphs 200, 200A, 200B, 200C, 200D and 200E, the horizontal axis is time and the vertical axis is voltage. The maximum voltage shown may effectively be the supply voltage Vdd. Although particular signals are shown, the graphs 200, 200A, 200B, 200C, 200D and 200E are for explanatory purposes only and are not intended to represent a particular implementation. Referring to FIGS. 3, 5 and 6A-6E, operation of the XNOR cell 100A is described.

Operation of the XNOR cell described below occurs after the weights are set for the magnetic junctions 112, 114, 116 and 118. The writing of the weights may be performed via STT by setting the select input to low, disabling the select transistor 140A. Thus, the magnetic junctions 110 and 120 are effectively decoupled from the output transistors 132 and 134. A write voltage is applied to input 102 and zero to input 104 to program the magnetic junctions 112, 114, 122 and 124 to a first set of states. A zero voltage is applied to input 102 and a write voltage to input 104 to program the magnetic junctions 112, 114, 122 and 124 to a second, opposite set of states. All four magnetic junctions 112, 114, 122 and 124 may thus be programmed in a single step. For SOT writing, current is driven through lines (not shown) adjacent to the free layers 117 and 125 of the magnetic junctions 112, 114, 122 and 124. As mentioned above, the magnetic junctions 112 and 122 are programmed with the weight, while the magnetic junctions 114 and 124 are programmed with the weight complement.

Figure 6A:
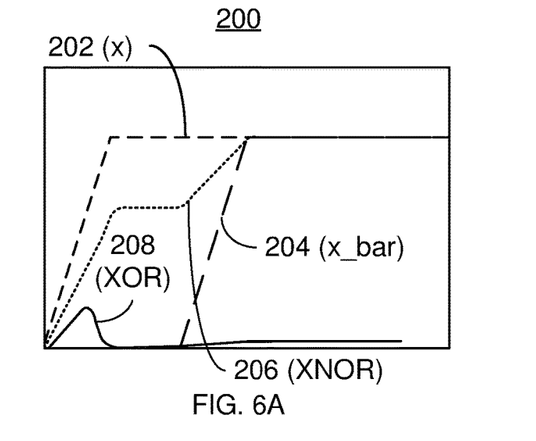
FIGS. 6A-6E are timing diagrams depicting operation of an exemplary embodiment of the hardware cell for performing a digital XNOR operation.
Figure 6B:
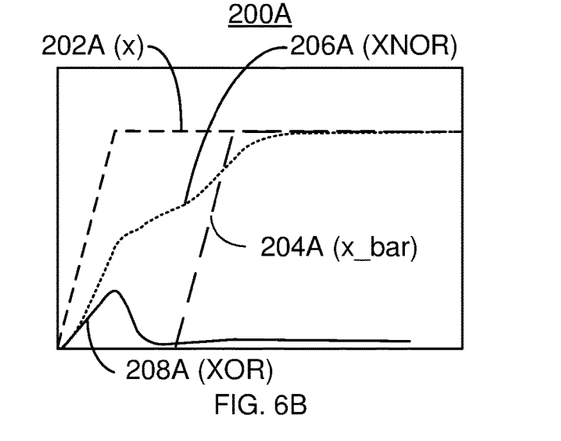

After the appropriate weights are programmed into the magnetic junctions 112, 114, 116 and 118, the XNOR cell is enabled via the select input/select transistor 140A and the appropriate inputs are provided. FIGS. 6A and 6B depict timing diagrams 200 and 200A for slow and fast clocks, respectively, for the input 102, x, being high (x_value=1, x_value_bar=0) and the weight, w being high (w=1). Initially, the inputs on lines 102 and 104 are set to the to the real inputs (x=x_value, x_bar=x_value_bar). The input 102 for x 202/202A is set high, while the input 104 for x_bar 204/204A is set low. As used herein, high is at or near Vdd while low is near zero, for example on the order of fifty millivolts or less. As can be seen in FIGS. 6A and 6B, there is some small delay as x increases to its final value. The complement x_bar 204/204A is low. As the input for x increases, the XOR output voltage 208/208A increases briefly. However, the XOR output voltage 208/208A settles to low after the sense amplifier formed by transistors 132 and 134 locks. Similarly, the XNOR output voltage 206/206A increases. The XNOR output 206/206A plateaus because of the voltage divider. This plateau is more pronounced for a slow clock.

The input stage 150/150A then sends both signals on lines 102 and 104 to Vdd (x=1) and x_bar=1). For the fast clock graph 200A, this occurs substantially halfway through the clock cycle. Because the inputs 102 and 104 are both high, current no longer flows through the voltage dividers formed by magnetic junctions 112 and 114 and magnetic junctions 122 and 124. Consequently, the XNOR 206/206A settles high. Thus, for x_value=1, w=1, XNOR=1 and XOR=0.

Figure 6C:
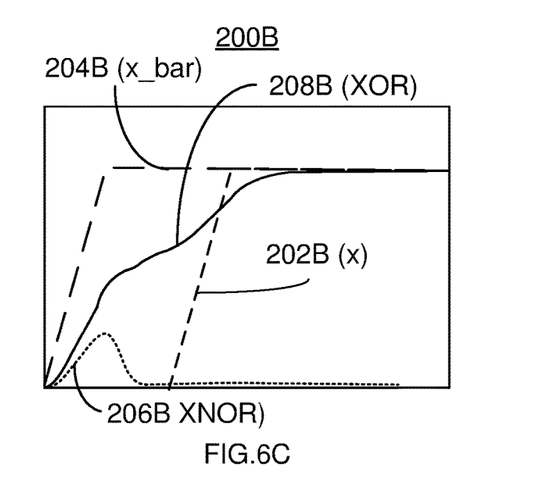

FIG. 6C depicts the timing diagram 200B for the input 102 being low (x_value=0, x_value_bar=1) and the weight, w being high (w=1). Initially, the inputs on lines 102 and 104 are set to the to the real inputs (x=x_value, x_bar=x_value_bar). The input 102 for x 202B is set low, while the input 104 for x_bar 204B is set high. As can be seen in FIG. 6C, there is some small delay as the complement x_bar 204B increases to its final value. The input x is low. As the input for x_bar increases, the XNOR output voltage 206B increases briefly. However, the XNOR output voltage 206B settles to low after the sense amplifier formed by transistors 132 and 134 locks. Similarly, the XOR output voltage 208B increases. The XOR output 208B plateaus because of the voltage divider. The input stage 150/150A then sends both signals on lines 102 and 104 to Vdd (x=1) and x_bar=1). Because the inputs 102 and 104 are both high, current no longer flows through the voltage dividers formed by magnetic junctions 112 and 114 and magnetic junctions 122 and 124. Consequently, the XOR 208B settles high. Thus, for x_value=0, w=1, XNOR=0 and XOR=1.

Figure 6D:
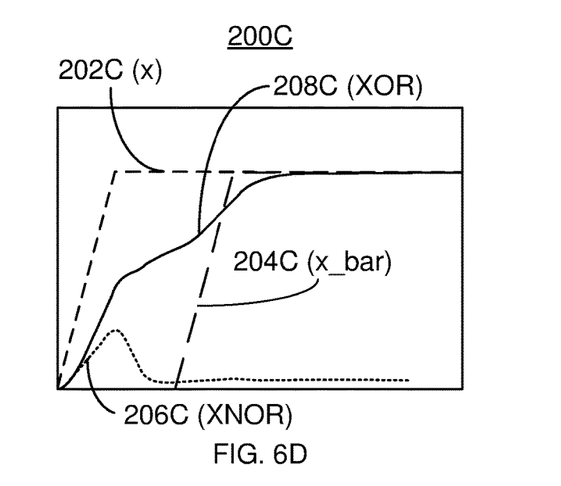

FIG. 6D depicts the timing diagram 200C for the input 102 being high (x_value=1, x_value_bar=0) and the weight, w being low (w=0). Initially, the inputs on lines 102 and 104 are set to the to the real inputs (x=x_value, x_bar=x_value_bar). The input 102 for x 202C is set high, while the input 104 for x_bar 204B is set low. As can be seen in FIG. 6D, there is some small delay as the input x 202C increases to its final value. The complement x_bar is low. As the input for x increases, the XNOR output voltage 206C increases briefly. However, the XNOR output voltage 206C settles to low after the sense amplifier formed by transistors 132 and 134 locks. Similarly, the XOR output voltage 208C increases. The XOR output 208C plateaus because of the voltage divider. The input stage 150/150A then sends both signals on lines 102 and 104 to Vdd (x=1) and x_bar=1). Because the inputs 102 and 104 are both high, current no longer flows through the voltage dividers formed by magnetic junctions 112 and 114 and magnetic junctions 122 and 124. Consequently, the XOR 208C settles high. Thus, for x_value=1, w=0, XNOR=0 and XOR=1.

Figure 6E:
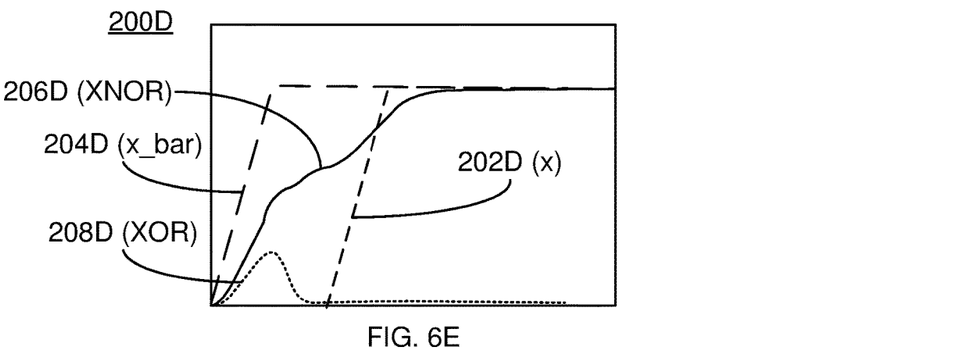

FIG. 6E depicts the timing diagram 200D for the input 102 being low (x_value=0, x_value_bar=1) and the weight, w being low (w=0). Initially, the inputs on lines 102 and 104 are set to the to the real inputs (x=x_value, x_bar=x_value_bar). The input 102 for x 202C is set low, while the input 104 for x_bar 204B is set high. As can be seen in FIG. 6E, there is some small delay as the input signal complement x_bar 204D increases to its final value. The input signal x is low. As the input for x_bar increases, the XOR output voltage 208D increases briefly. However, the XOR output voltage 208D settles to low after the sense amplifier formed by transistors 132 and 134 locks. Similarly, the XNOR output voltage 206D increases. The XNOR output 206D plateaus because of the voltage divider. The input stage 150/150A then sends both signals on lines 102 and 104 to Vdd (x=1) and x_bar=1). Because the inputs 102 and 104 are both high, current no longer flows through the voltage dividers formed by magnetic junctions 112 and 114 and magnetic junctions 122 and 124. Consequently, the XNOR 206D settles high. Thus, for x_value=0, w=0, XNOR=1 and XOR=0.

Thus, the XNOR cell 100A has the appropriate truth table. Because it is implemented in hardware, the XNOR cell 100A may carry out the XNOR operation efficiently. Further, because the output is digital, issues with analog XNOR operations may be reduced or eliminated. For example, electrical noise and unrecoverable signal loss due to IR drop may be avoided. Moreover, the signal output is taken from a voltage divider that is essentially composed of magnetic junctions. Consequently, the voltage provided by the divider is insensitive to global processing variations. The weights are also stored locally in the magnetic junctions 110 and 120, which function both as nonvolatile memory and resistors for a voltage divider. Consequently, time taken to access DRAM to obtain the weights is avoided. The outputs of the XNOR cell 100A may also be close to zero and Vdd for a 0 and 1, respectively. Thus, a substantially full swing output may be obtained. Further, selection of the threshold voltage of the select transistor 140A may affect the output. For a low threshold voltage (low resistance) of the select transistor 140A, the pull up of the output signals is more rapid. However, there is generally a finite voltage (e.g. on the order of fifty millivolts) instead of a true zero for logical 0. For a regular threshold voltage (higher resistance), the pull up is slower, but the output voltage for a logical zero is very low (e.g. on the order of a few millivolts). Thus, performance of the XNOR cell 100A may be tuned using the select transistor 140A. The XNOR cell 100A may thus perform XNOR operations digitally, rapidly, at lower power and with an output that is insensitive to global processing variations. Although a neural net employing the XNOR cell 100A may require more neurons for accuracy, this may be at least partially remedied by hardware-aware training such as weight optimization performed with the assumption that the final weights are binary.

Figure 7:
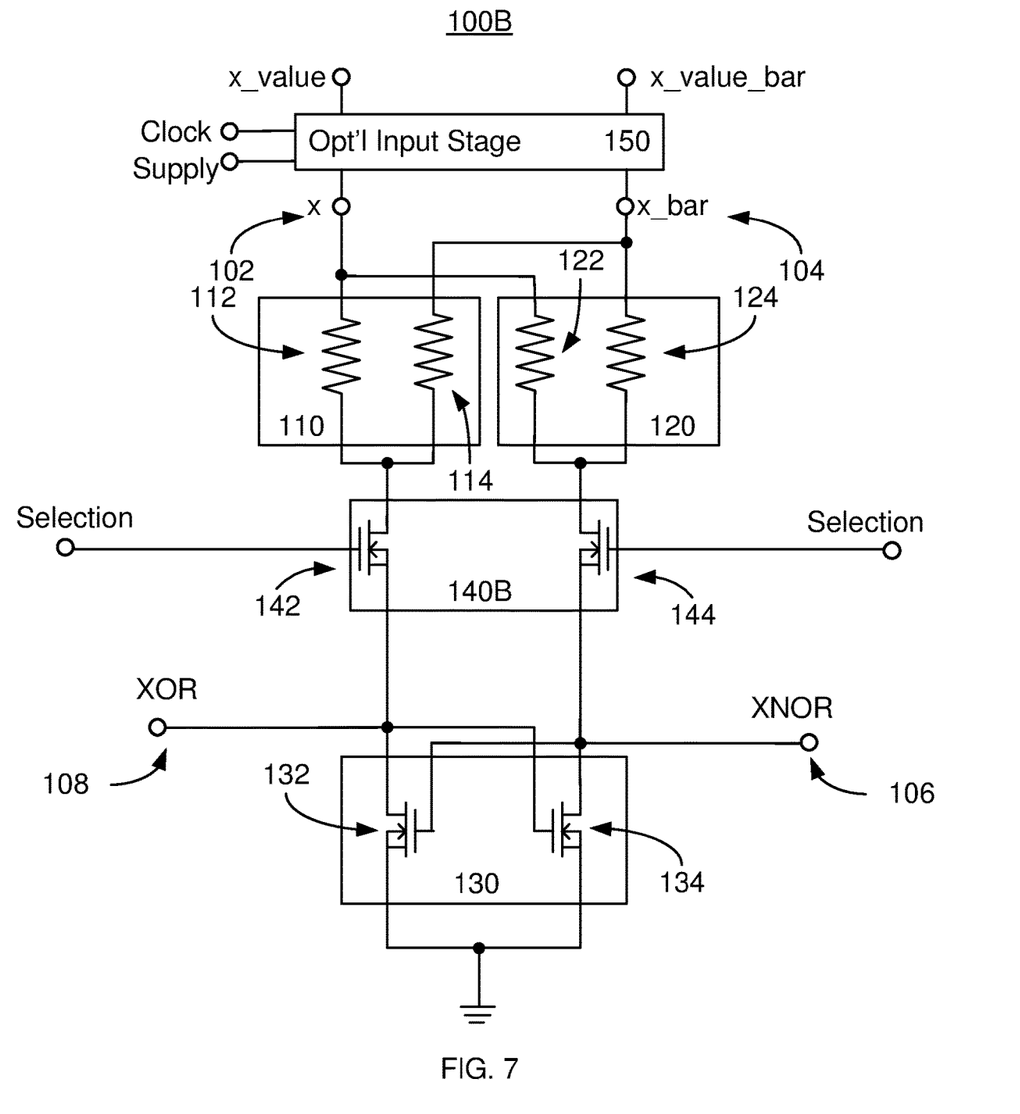
FIG. 7 depicts an exemplary embodiment of another hardware cell for performing a digital XNOR operation

FIG. 7 depicts another exemplary embodiment of a hardware cell 100B for performing a digital XNOR operation. The XNOR cell 100B is analogous to the XNOR cells 100100A and may be used in the binary neuron 180 or other application. Consequently, portions of the XNOR cell 100B analogous to components in the XNOR cells 100 and/or 100A are labeled similarly. Thus, the XNOR cell 100B includes input lines 102 and 104, pairs 110 and 120 of magnetic junctions, output transistors 130, output lines 106 and 108, selection transistors 140B and input stage 150 that are analogous to input lines 102 and 104, pairs 110 and 120 of magnetic junctions, output transistors 130, output lines 106 and 108, selection transistor(s) 140/140A and output stage 150/150A, respectively.

The XNOR cell 100B operates in an analogous manner to the XNOR cell 100A. However, the select transistors 140B differ from the select transistor 140A. In the XNOR cell 140B, two select transistor 142 and 144 are used. Instead of being connected between the output transistors 130 and ground, the select transistors 142 and 144 are coupled between the output transistors 130 and the magnetic junction pairs 110 and 120. When enabled by selection inputs, the selection transistors 142 and 144 couple the pairs 110 and 120, respectively, with the output transistors 130.

The XNOR cell 100B shares the benefits of the XNOR cell 100A. Because the output is digital, issues with analog XNOR operations may be reduced or eliminated. Moreover, the signal output is taken from a voltage divider that is essentially composed of magnetic junctions. Consequently, the voltage provided by the divider is insensitive to global processing variations. The weights are also stored locally in the magnetic junctions 110 and 120. Consequently, time taken to access DRAM to obtain the weights is avoided. The outputs of the XNOR cell 100B may a full swing output (Vdd and close to zero) may be obtained. Thus, performance of the XNOR cell 100A may be tuned using via the select transistor 140A. The XNOR cell 100B may thus perform XNOR operations digitally, rapidly, at lower power and with an output that is insensitive to global processing variations.

Figure 8:
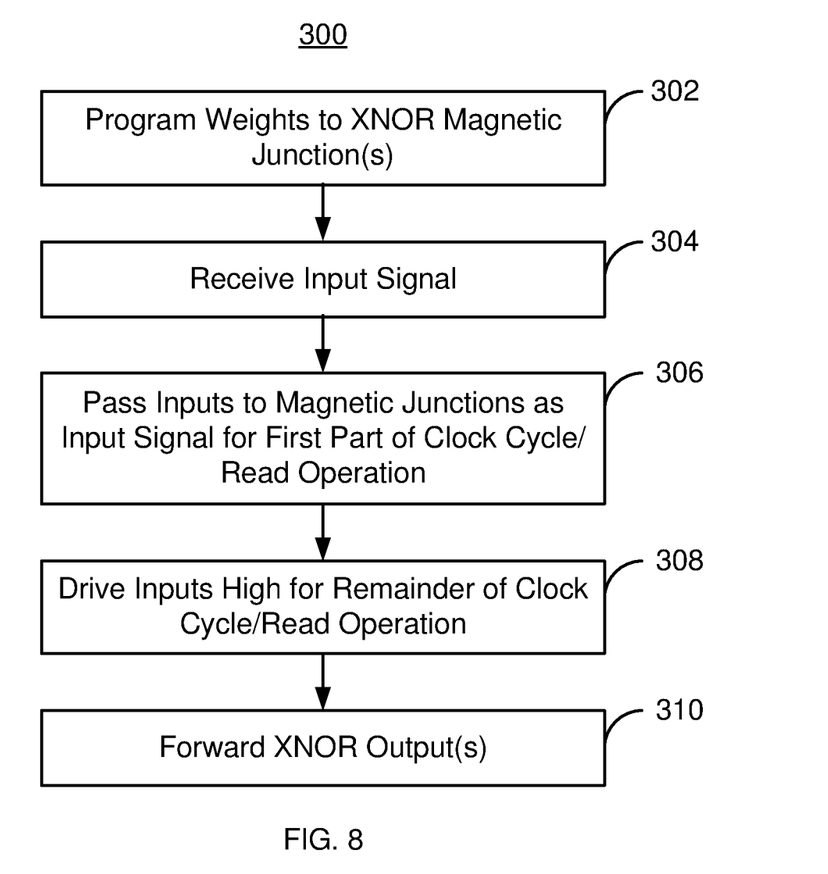
FIG. 8 is a flow chart depicting an exemplary embodiment of a method for performing an XNOR operation using an exemplary embodiment of the hardware cell.

FIG. 8 is a flow chart depicting an exemplary embodiment of a method for performing an XNOR operation using an exemplary embodiment of the hardware cell. For simplicity, some steps may be omitted, performed in another order and/or combined. The method 300 is also described in the context of the XNOR cell 100A. However, the method 300 may be used in connection with another XNOR cell, such as the device(s) 100 and/or 1008.

The weights are programmed into the magnetic junctions 112, 114, 122 and 124, via step 302. Step 302 thus programs the weight, w, into magnetic junctions 112 and 122 and the weight complement, w_bar, in to magnetic junctions 114 and 124. Although shown as part of the flow 300, the step 302 may be carried out well before and be decoupled from the remaining steps of the method 300.

The signal and its complement are received, via step 302. Step 302 may include receiving x_value and x_value_bar in the input stage 150. The inputs are passed to the magnetic junctions, via step 306. Thus, x and x_bar are x_value and x_value_bar, respectively, on the input lines 102 and 104. As a result, the output of the XNOR cell 100A begins to be driven high or low, depending upon the inputs and the weights. This continues until well after the sense amplifier formed from output transistors 132 and 134 locks.

The inputs 102 and 104 are driven high for the remainder of the clock cycle or read operation, via step 308. As a result, the outputs are driven very close to Vdd and zero volts. The output(s) of the XNOR cell 100A may then be forwarded, via step 310. Thus, the output of the XNOR cell may be provided to the next component in the neural network or other device of which the XNOR cell 100A is a part.

Thus, using the method 300, the XNOR cells 100, 100A, 1008 and/or an analogous device may be used. As a result, the advantages of one or more the XNOR cells 100, 100A, 100B and/or analogous device may be achieved. A method and system for performing digital XNOR operations in hardware has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A hardware cell for performing a digital XNOR operation of an input signal with a weight comprising:
   a plurality of input lines for receiving the input signal and an input signal complement;
   a plurality of pairs of magnetic junctions coupled with the plurality of input lines and storing the weight, each pair of magnetic junctions including a first magnetic junction and a second magnetic junction, each of the first magnetic junction and the second magnetic junction including a reference layer, a free layer and a nonmagnetic spacer layer between the reference layer and the free layer, the free layer having a plurality of stable magnetic states and programmable using at least one of spin-transfer torque (STT) and spin-orbit interaction torque (SOT), the first magnetic junction receiving the input signal, the second magnetic junction receiving the input signal complement;

a plurality of output transistors coupled with the plurality of magnetic junctions such that each pair of magnetic junctions form a voltage divider, the plurality of output transistors forming a sense amplifier; and at least one selection transistor coupled with the plurality of output transistors.

2. The hardware cell of claim 1 wherein the plurality of output transistors includes a first output transistor and a second output transistor, the first output transistor being connected between the first magnetic junction and the second magnetic junction of the plurality of pairs of magnetic junction and to an XNOR output.

3. The hardware cell of claim 2 wherein the first output transistor has a first source, a first drain and a first gate, the second output transistor has a second source a second drain and a second gate, the first drain being connected between the first magnetic and the second magnetic junction of a first pair of magnetic junctions, the first drain being connected to the second gate of the second output transistor and to the XNOR output, the first gate being connected to the second drain of the second output transistor, the second drain connected between the first magnetic and the second magnetic junction of the second pair of magnetic junctions, the first magnetic junction of the first pair of magnetic junctions storing the weight and the second magnetic junction of the first pair of magnetic junctions storing a weight complement, the first magnetic junction of the second pair of magnetic junctions storing the weight complement, the second magnetic junction of the second pair of magnetic junctions storing the weight.

4. The hardware cell of claim 3 wherein the second drain is connected to an XOR output.

5. The hardware cell of claim 3 wherein the at least one selection transistor includes a single selection transistor having a selection transistor source, a selection transistor gate and a selection transistor drain, the selection transistor drain being coupled with the first source and the second source.

6. The hardware cell of claim 3 wherein the at least one selection transistor includes a first selection transistor and a second selection transistor, the first selection transistor having a first selection transistor source and a first selection transistor drain, the second selection transistor having a second selection transistor source and a second selection transistor gate, the first selection transistor source being connected with the first output transistor drain, the first selection transistor drain being connected between the first magnetic junction and the second magnetic junction of the first pair of magnetic junctions, the second selection transistor source being connected with the second output transistor drain, the second selection transistor drain being connected between the first magnetic junction and the second magnetic junction of the second pair of magnetic junctions.

7. The hardware cell of claim 3 wherein the second pair of magnetic junctions are conventional magnetic junctions and wherein the first pair of magnetic junctions are bottom to up magnetic junctions.

8. The hardware cell of claim 3 further comprising:

a pair of signal lines for providing an input signal value on a first signal line and an input signal complement on a second signal line;

an input stage coupled to the plurality of input lines, to the pair of signal lines and to a supply voltage, the input stage for providing the input signal value and the input signal complement value to the plurality of input lines for a first portion of a time period and for providing a supply voltage to the plurality of input lines for a second portion of the time period.

9. The hardware cell of claim 8 wherein the input stage further includes:

a first multiplexer coupled to the first signal line, the supply voltage and a first input line of the plurality of input lines, the first input line carrying the input signal; and a second multiplexer coupled to the second signal line, the supply voltage and a second input line of the plurality of input lines, the second input line carrying the input signal complement.

10. The hardware cell of claim 1 wherein the nonmagnetic spacer layer is a tunneling barrier layer.

11. A neural network comprising:

a plurality of XNOR cells, each of the plurality of XNOR cells for performing a digital XNOR operation of an input signal with a weight, each of the plurality of XNOR cells including a pair of input lines, a plurality of pairs of magnetic junctions coupled with the plurality of input lines, a plurality of output transistors and at least one selection transistor, the pair of input lines for receiving the input signal and an input signal complement, the plurality of pairs of magnetic junctions coupled with the plurality of input lines and storing the weight, each pair of magnetic junctions including a first magnetic junction and a second magnetic junction, each of the first magnetic junction and the second magnetic junction including a reference layer, a free layer and a nonmagnetic spacer layer between the reference layer and the free layer, the free layer having a plurality of stable magnetic states and programmable using at least one of spin-transfer torque (STT) and spin-orbit interaction torque (SOT), the first magnetic junction receiving the input signal, the second magnetic junction receiving the input signal complement, the plurality of output transistors being coupled with the plurality of magnetic junctions such that each pair of magnetic junctions form a voltage divider, the plurality of output transistors forming a sense amplifier, the at least one selection transistor coupled with the plurality of output transistors; and a plurality of lines coupling the plurality of XNOR cells.

12. The neural network of claim 11 wherein the plurality of output transistors includes a first output transistor and a second output transistor, the first output transistor having a first source, a first drain and a first gate, the second output transistor having a second source a second drain and a second gate, the first drain being connected between the first magnetic and the second magnetic junction of a first pair of magnetic junctions, the first drain being connected to the second gate of the second output transistor and to the XNOR output, the first gate being connected to the second drain of the second output transistor, the second drain connected between the first magnetic and the second magnetic junction of the second pair of magnetic junctions, the first magnetic junction of the first pair of magnetic junctions storing the weight and the second magnetic junction of the first pair of magnetic junctions storing a weight complement, the first magnetic junction of the second pair of magnetic junctions storing the weight complement, the second magnetic junction of the second pair of magnetic junctions storing the weight.

13. The neural network of claim 12 further comprising:
a pair of signal lines for providing an input signal value on a first signal line and an input signal complement on a second signal line;
and wherein each of the plurality of XNOR cells includes an input stage coupled to the plurality of input lines, to the pair of signal lines and to a supply voltage, the input stage for providing the input signal value and the input signal complement value to the plurality of input lines for a first portion of a time period and for providing a supply voltage to the plurality of input lines for a second portion of the time period.

14. The neural network of claim 13 wherein the input stage further includes:
a first multiplexer coupled to the first signal line, the supply voltage and a first input line of the plurality of input lines, the first input line carrying the input signal; and
a second multiplexer coupled to the second signal line, the supply voltage and a second input line of the plurality of input lines, the second input line carrying the input signal complement.

15. A method for performing a digital XNOR operation comprising:
receiving an input signal and an input signal complement;
providing the input signal and the input signal complement to an XNOR cell for performing a digital XNOR operation of the input signal with a weight, the XNOR cell including a plurality of pairs of magnetic junctions coupled with the plurality of input lines, a plurality of output transistors and at least one selection transistor, each pair of magnetic junctions storing a weight and including a first magnetic junction and a second magnetic junction, each of the first magnetic junction and the second magnetic junction including a reference layer, a free layer and a nonmagnetic spacer layer between the reference layer and the free layer, the free layer having a plurality of stable magnetic states programmable using at least one of spin-transfer torque (STT) and spin-orbit interaction torque (SOT), the first magnetic junction receiving the input signal, the second magnetic junction receiving the input signal complement, the plurality of output transistors comprising pair of output transistors including a first output transistor and a second output transistor, the first output transistor being connected between the first magnetic junction and the second magnetic junction of the plurality of pairs of magnetic junction and to an XNOR output, the second output transistor being connected between the first magnetic junction and the second magnetic junction of the plurality of pairs of magnetic junctions, the at least one selection transistor coupled with the first output transistor and the second output transistor.

16. The method of claim 15 wherein the input signal is a true input signal during a first portion of a clock cycle, the input signal complement is a true input signal complement during the first portion of the clock cycle, the input signal is a logical high signal during a second portion of the clock cycle, and the input signal complement is high during a second part of the clock cycle.

17. The method of claim 16 wherein the first output transistor has a first source, a first drain and a first gate, the second output transistor has a second source a second drain and a second gate, the first drain being connected between the first magnetic and the second magnetic junction of a first pair of magnetic junctions, the first drain being connected to the second gate of the second output transistor and to the XNOR output, the first gate being connected to the second drain of the second output transistor, the second drain connected between the first magnetic and the second magnetic junction of the second pair of magnetic junctions, the first magnetic junction of the first pair of magnetic junctions storing the weight and the second magnetic junction of the first pair of magnetic junctions storing a weight complement, the first magnetic junction of the second pair of magnetic junctions storing the weight complement, the second magnetic junction of the second pair of magnetic junctions storing the weight.

* * * * *